Nov. 19, 1968 A. B. GREBENE 3,412,296

MONOLITHIC STRUCTURE WITH THREE-REGION OR FIELD EFFECT COMPLEMENTARY TRANSISTORS

Filed Oct. 19, 1965

INVENTOR

Alan B. Grebene

BY Connolly and Hutz

ATTORNEYS

United States Patent Office 3,412,296

Patented Nov. 19, 1968

3,412,296

MONOLITHIC STRUCTURE WITH THREE-REGION OR FIELD EFFECT COMPLEMENTARY TRANSISTORS

Alan B. Grebene, Waterford, N.Y., assignor to Sprague Electric Company, North Adams, Mass., a corporation of Massachusetts Filed Oct. 19, 1965, Ser. No. 497,831
9 Claims. (Cl. 317—234)

ABSTRACT OF THE DISCLOSURE

Each of a plurality of semiconductor pockets isolated within a substrate by a dielectric layer have spaced apart source and drain regions with an interposed gate region, and the gate regions are of substantially equal penetration within the pockets such that the relative thickness of the channel sandwiched between the gate and the dielectric layer is determined by the pocket depth.

This invention relates generally to semiconductor structures and more particularly to field-effect transistors and combinations of these with bipolar transistors in monolithic structures, and to methods of making the same.

The conventional diffused gate field-effect or unipolar transistor is made up of a monocrystalline substrate or body having regions of different conductivity type extending into the body from a major surface. In devices of this type, a gate region of one conductivity type is normally provided between source and drain regions of the other conductivity type; with suitable connections provided through openings in an overall passivating layer.

In one form of this type field-effect transistor, source and drain regions of high N-type conductivity are produced in a zone of low N-type conductivity which, in turn, is seated in a P-type substrate. A P-type gate is provided between the regions to leave a portion of the zone as a channel sandwiched between the gate and substrate.

Devices of the above type have various shortcomings. For example, the presence of excessive stray capacitance between the various regions and the substrate results in lower gain-bandwidth product. In addition, in integrated construction where a plurality of field-effect transistors are provided in a single substrate, the DC operating point of the transistors is severely limited and the units are prone to capacitive feedback, since the substrate serves as a common backgate to all field-effect transistors.

Some of the latter disadvantages may be alleviated in integrated field-effect transistors by providing separate diffused backgate regions. This technique, however, has additional shortcomings due to the excessive number of diffusion steps required and the difficulty of providing a uniform impurity profile in the channel region. Generally, it results in low gate to channel breakdown, low transconductance, increased gate to channel capacitance and thus overall degraded performance. Other modifications of this technique, to provide uniformly doped channel regions, in turn require such close processing control as to be impractical.

These disadvantages are also encountered in monolithic combinations of the diffused gate field-effect transistor with other semiconductor devices. For example, when unipolar and bipolar transistors are provided in a monolithic unit, the substrate is the backgate of the former and the collector of the latter. This not only restricts the DC operating point and increases the parasitic feedback of the devices, but also requires either a compromise of desired characteristics or exceptionally tight process control.

The latter results from the need in bipolar transistors for a high conductivity collector region not in contact with the base whereas in field-effect devices a narrow channel of low conductivity is required. To provide both within a single substrate is generally impractical in the prior art.

Consequently, it is desirable to provide a field-effect transistor structure in which the reverse p-n junction of the backgate is eliminated, and which is capable of being easily and economically constructed on a monolithic piece of silicon, along with other semiconductor devices.

It is an object of this invention to provide a field-effect transistor having a dielectrically terminated channel.

It is another object of this invention to provide a field-effect transistor having minimized stray capacitance, improved gain-bandwidth product and improved high frequency performance.

It is a further object of this invention to provide an economical monolithic structure containing isolated field-effect transistors of varied pinch-off voltages along with isolated bipolar transistors.

It is a still further object of this invention to provide a process whereby isolated pockets of different depths and different impurity concentration may be realized within a monolithic chip.

It is a still further object of this invention to provide a process whereby a plurality of field-effect transistors may be constructed along with other semiconductor devices within a monolithic chip.

These and other objects of this invention will become more apparent upon consideration of the following description taken together with the accompanying drawings in which.

Figure 1:
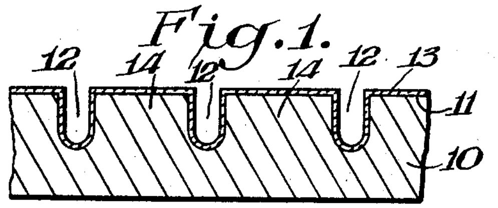
FIGURES 1–4 are schematic sectional diagrams illustrative of a method of fabricating dielectrically isolated pockets of different depth in accordance with the invention.

In general, the objects of this invention are attained by a semiconductor structure comprising a substrate having at least one pocket of semiconductor material isolated by a dielectric layer. The pocket has spaced apart source and drain regions, an interposed gate region, and a channel area sandwiched between the gate and the dielectric layer.

A monolithic structure having unipolar transistors of varied pinch-off voltages is provided by a device which comprises a substrate having a plurality of semiconductive pockets of different depth isolated by a dielectric layer. Each pocket has spaced apart source and drain regions, an interposed gate region, and a channel area sandwiched between the gate and the dielectric layer. The gate regions have equal penetration such that the relative channel thickness is determined by the pocket depth.

A further monolithic structure having both unipolar and bipolar transistors is provided in accordance with this invention by a device comprising a substrate having a plurality of semiconductive pockets of different depth isolated by a dielectric layer. Deep pockets have an upper zone of low conductivity and a lower zone of high conductivity whereas pockets of shallow and intermediate depth are of substantially low conductivity throughout. The deep pockets have a base region within the upper zone and an emitter region within the base region. Both zones of the deep pocket provide a collector. The shallow and intermediate pockets have source and drain regions, an interposed gate region and a channel area sandwiched between the gate and the dielectric layers. The base and gate regions have equal penetration in their respective pockets so that in shallow and intermediate pockets different channel thicknesses are provided while in the deep pocket the base region does not contact the high conductivity zone.

Briefly, the process for forming a semiconductor structure having isolated pockets of different depth in accordance with the invention includes the steps of forming mesas of different height on one major surface of a semiconductor wafer, forming a dielectric layer over said mesas, forming a substrate over said layer, and removing the opposed major surface of said wafer to expose the dielectric layer at the bottom of said mesa edge thereby providing pockets of varied depth isolated by a dielectric layer, the depth of each pocket being determined by the height of the corresponding mesa.

In a more limited sense, the process for forming a semiconductor structure having isolated pockets of varied depth include the steps of etching moats of substantially equal depth within a monocrystalline silicon wafer at a major surface thereof to provide a plurality of mesas having top surfaces substantially coplanar with said major surface, etching the top surface of at least one of said mesas to reduce the height of at least a substantial portion of said mesa, oxidizing said wafer to provide a dielectric layer over said mesas and the surfaces of said moats, growing a polycrystalline silicon substrate over said dielectrically coated mesas, and etching away the opposed major surface of said wafer to form a further major surface substantially coplanar with the bottom of said moats thereby exposing said dielectric layer at said bottom and providing pockets of different depth isolated from one another and said substrate by said dielectric layer, the depth of each pocket being determined by the height of the corresponding mesa.

Briefly, the process for producing a semiconductor structure having isolated pockets of non-uniform impurity concentration and different depth includes the steps of forming mesas of different height on one major surface of a semiconductive wafer, said wafer having a layer of high conductivity at said surface, at least one of said mesas lying wholly below said high conductivity layer, forming a dielectric layer over said mesas, forming a substrate over said dielectric layer, and removing the opposed major surface of said wafer to expose the dielectric layer at the bottom of said mesa edges thereby providing pockets of varied depth isolated by a dielectric layer, the depth of each pocket being determined by the height of the corresponding mesa.

Referring now to the drawings and in particular to FIGURE 1 thereof wherein a semiconductor wafer 10 of silicon or the like is shown having a plurality of isolation moats 12 and an overlying dielectric layer 13.

The illustrated structure is formed in the preferred embodiment, from a monocrystalline wafer 10 of silicon or the like by etching moats 12 through a major surface 11. The major surface 11 is first polished by chemical or mechanical means and wafer 10, then oxidized to provide a masking layer. Openings to surface 11 are provided in the mask by conventional photo-etch techniques and deep moats 12 are then etched in wafer 10 to form isolated mesas 14. The structure is again oxidized to produce a dielectric coat 13 within moats 12, as well as over surface 11.

The mesas 14 may be formed by etching any suitable moat pattern in the wafer. Thus parallel moats may be cut across a narrow wafer, or circular moats may be utilized. In addition, a group of parallel moats may be etched at right angles to a similar group to form a rectangular or square surface mesas.

Figure 2:
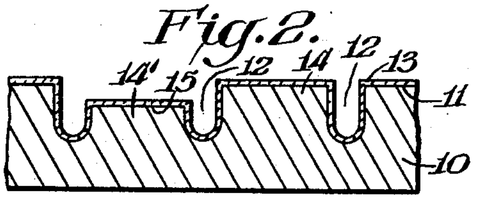

A shortened mesa or frustrum 14', as shown in FIGURE 2, is formed by removing the masking oxide 13 from surface 11 of one of the mesas 14 and by etching the mesa back to provide a surface 15 slightly below major surface 11. The wafer is again oxidized to restore the oxide layer 13 over the mesa frustrum 14'. Accordingly, the shortened height of the frustrum 14' provides a depression in the line of major surface 11, however, it should be noted that the dielectric layer 13 is a continuous coat which includes the coating over surface 11, within the moats 12, and over the depressed surface 15. Although, the whole top surface of mesa 14 is reduced in this embodiment, it should be understood that the same purpose may be also accomplished by merely reducing or lowering only a center portion of the mesa.

Figure 3:
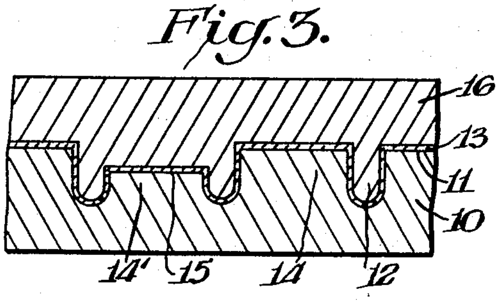
Figure 8:
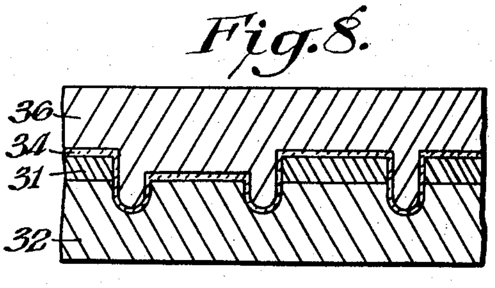
Figure 4:
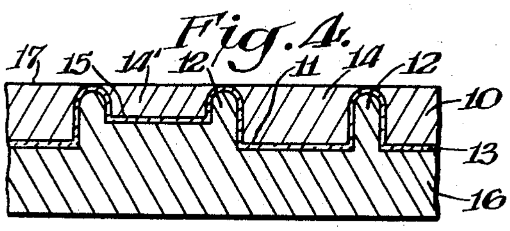

A suitable support or substrate 16, as shown in FIGURE 3, such as polycrystalline silicon or the like is then grown over the dielectric layer 13. Wafer 10 with substrate 16 is then turned over, as shown in FIGURE 4, and the wafer surface 10 opposite surface 11 is suitably removed to expose the dielectric at the bottom of the moats 12. This may be accomplished by lapping, chemical polishing, or etching. The removal provides a further major surface 17 of wafer 10 and provides a structure having pockets 14 and 14' isolated from the support 16 and from each other by dielectric layer 13. It is a feature of this invention that the shortened mesa 14' provides a shallow pocket 14' extending to surface 15, whereas mesa 14 of full height provides a deeper pocket 14 extending to surface 11.

Accordingly by the simultaneous diffusion of similar regions in the various pocket, field-effect transistors having different channel thickness, and subsequently different pinch-off voltages may be provided in a single substrate. This is illustrated in FIGURE 5 wherein spaced apart source and drain regions 18 and 19, separated by an interposed gate region 20 are shown in both pocket 14 and pocket 14'.

Figure 5:
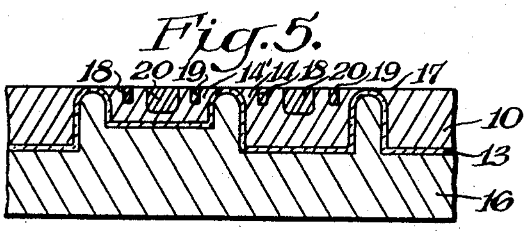
FIGURE 5 is a schematic sectional diagram of a plurality of field-effect transistors having channels terminated by a dielectric layer.

The unipolar transistors shown in FIGURE 5 are formed by conventional means, such as by diffusion or the like; however, in the preferred embodiment, similar regions of each pocket are formed simultaneously to provide channels having varied cross sections. Thus, the serious disadvantages of separate diffusion of similar regions is avoided. Furthermore, each unit is isolated and each channel is terminated by a dielectric layer, rather than the conventional backgate.

Either NPN or PNP field-effect transistors may be constructed in the manner described. For example, a low N-type conductivity silicon wafer 10 having an impurity concentration of approximately $10^{15}$ to $10^{16}$ atoms/cm. is formed in the described manner to provide pockets 14 and 14' having this impurity level. Thereafter, as illustrated in FIGURE 5, spaced apart N-type source and drain regions 18 and 19 are formed in any number of pockets by the simultaneous diffusion of N-type impurities into surface 17 through appropriate openings in an oxide mask (not shown). In this manner, N-type source and drain regions having a surface concentration of approximately $10^{19}$ atoms/cm. are provided.

The masking coat is again formed over surface 17 and a further opening provided between each source 18 and drain 19. Thereafter, a gate region 20 of high P-type conductivity having a surface concentration of approximately $10^{19}$ atoms/cms. is formed between each source 18 and drain 19 by the simultaneous diffusion of appropriate impurities.

Advantageously, the simultaneous diffusion results in similar regions having equal depth in each of the pockets. The equal penetration of the gate regions will, however, provide a thinner channel in shallow pocket 14' than in pocket 14 since the channel cross section is determined by the penetration of the gate 20 and the depth of the isolating layer 13.

Consequently, since the pinch-off voltage of the unipolar field-effect transistor is proportional to the square of the channel cross section, transistors having various pinch-off voltages may be economically provided. Individual unipolar transistors or monolithic groups of these having uniform or varied pinch-off voltage may be constructed in the manner described. The uniformity results, of course, from the simultaneous diffusion whereas the variation is provided by the depth of the pocket.

Since the novel channel termination is the dielectric layer which isolates the pockets, each unipolar device has low stray capacitance and low parisitic feedback. Thus the structure may be diced to provide separate units, having leads or connections to regions 18, 19 and 20. The units may also be employed as individual devices on the same substrate or be interconnected between themselves and other devices, formed in similar pockets, to provide monolithic microcircuits in which each device is well isolated.

Accordingly in a further embodiment of this invention, as illustrated in FIGURES 6 to 10, both unipolar and bipolar devices may be formed within a single substrate. Construction of the basic isolated pocket structure is similar to that described for the unipolar transistors with, however, the addition of a high conductivity region in a deep pocket.

Figure 6:
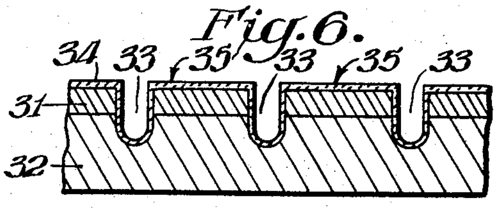
FIGURES 6–9 are schematic sectional diagrams illustrative of a method of fabricating dielectrically isolated pockets having zones of different impurity concentration.

Thus, as shown in FIGURE 6, a region or layer 31 of high conductivity overlies a wafer 32 of low conductivity. Isolation moats 33, and a dielectric layer 34 are provided as previously described. For example, a monocrystalline silicon wafer 32 of low N-type conductivity is formed. Thereafter, by conventional means a layer 31 of high N-type conductivity is provided overlying wafer 32. This layer or region 31 may be formed by diffusion of N-type impurities within the upper portion of wafer 32, or by epitaxial growth.

Once layer 32 is complete, moats 33 and an overall dielectric coat 34 are provided to form dielectrically coated mesas 35. It should be noted, however, that the moats pass thru layer 31 and penetrate a substantial depth in wafer 32.

Figure 7:
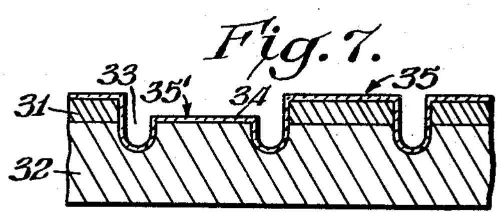

One of the mesas 35 is then etched, as shown in FIGURE 7, to remove the high conductivity portion 31 of that mesa, leaving a frustrum 35' of entirely low conductivity material. The process, as described earlier, is continued. Thus, a support or substrate 36 of polycrystalline silicon or the like is grown over the oxide 34. The structure is then turned over and the lower portion of wafer 32 removed to expose the oxide of the moats.

Figure 9:
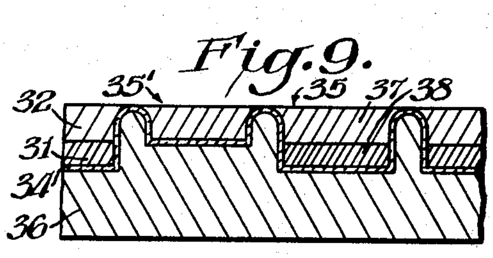

This provides a structure, illustrated in FIGURE 9, having a shallow pocket 35' of low conductivity and a deep pocket 35 having an upper zone 37 of similar low conductivity and a lower zone 38 of high conductivity. The shallow pocket 35', corresponds, of course, to the short mesa 35' whereas the deep pocket 35 corresponds to mesa 35.

Figure 10:
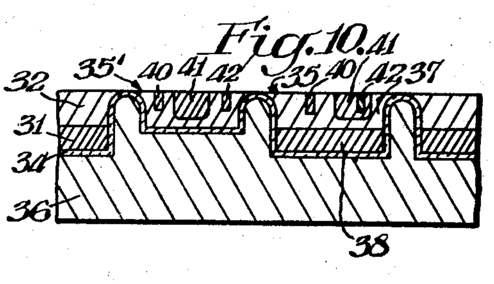
FIGURE 10 is a schematic sectional diagram of unipolar and bipolar transistors dielectrically isolated within a monolithic structure.

This novel structure permits the construction of both unipolar and bipolar transistors within a monolithic substrate, as illustrated in FIGURE 10. As shown in this figure, N-type source and drain regions 40 and 42 and P-type gate region 41 provide a unipolar field-effect transistor in pocket 35', while similar regions provide a collector contact, an emitter, and base respectively of a bipolar transistor in pocket 35. In the latter pocket, the high conductivity region 38 provides a low resistance portion of the collector, necessary for good bipolar performance.

Appropriate conductivity type is provided in each case. Thus, where pockets 35 and 35' are N-type, regions 41 are simultaneously formed in each pocket by diffusion of P-type impurities to provide high P-type conductivity regions therein. The depth of region 41 is less than the depth of the most shallow pocket to permit a channel between the region and the dielectric 34 in shallow pockets while providing a base region, not in contact with the high conductivity zone 38, in deep pockets. Thereafter regions 40 and 42 are formed by the simultaneous diffusion of N-type impurities in spaced apart portions of each pocket. It should be noted, however, that in low conductivity pockets 35' the latter regions 40 and 42 have region 41 interposed between them to provide source, drain and gate respectively of a unipolar transistor, whereas in pocket 35 one of the N-type regions 42 is formed within region 41 to provide the emitter of a bipolar transistor. Region 41, in this case, is the base of the device whereas the remaining region 42 along with pocket 35 provides the collector.

Other embodiments are also useful. For example, low conductivity pockets of varied depths (shallow and intermediate) may be provided in the structure, in addition to a deep pocket having dual conductivity levels. These could be provided, for example, by forming frustrums of different height in the structure of FIGURE 7, below the high conductivity layer. In this manner, isolated field-effect devices having different channel cross sections or pinch-off voltages may be formed along with biploar transistors within a single substrate.

As indicated, the invention may be practiced with both NPN and PNP transistors. In addition, germanium and other semiconductors as well as different dielectrics, such as other compounds of silicon, may be useful.

Thus, it should be understood that many different embodiments of this invention may be made without departing from the spirit and scope hereof and that the invention is not to be limited except as defined in the appended claims.

What is claimed is:

1. A semiconductor comprising a substrate having at least two pockets of monocrystalline semiconductive material of low conductivity and one conductivity type, said pockets being of different depth and isolated from each other and said substrate by a dielectric layer, said pockets each having a spaced apart source and drain region of high conductivity and said one conductivity type and an interposed gate region having high conductivity of the other conductivity type, said pockets having a channel area sandwiched between each gate region and said dielectric layer, and said gate regions having substantially equal penetration within their respective pockets for providing a thinner channel in said shallow pocket than in said other pocket.

2. A semiconductor as claimed in claim 1 wherein said substrate is polycrystalline silicon, said pocket material is monocrystalline silicon, and said layer is a dielectric compound of silicon.

3. A semiconductor as claimed in claim 2 wherein said one conductivity type is N-type, and said other conductivity type is P-type.

4. A semiconductor comprising a substrate having at least two pockets of monocrystalline semiconductive material of one conductivity type,. said pockets being of different depth and isolated from each other and said substrate by a dielectric layer, one of said pockets being of shallow depth and having low conductivity, said shallow pocket having spaced apart source and drain regions of high conductivity and said one conductivity type and an interposed gate region of high conductivity and the other conductivity type and a channel area sandwiched between said gate and said dielectric layer, the other of said pockets being of deep depth and having an upper zone of low conductivity and a lower zone of high conductivity, said lower zone being at a depth greater than that of said shallow pocket, and said upper zone having a base region of high conductivity and said other conductivity type, said gate and base region having substantially equal penetration within their respective pockets for providing said channel in said shallow pocket and said base region wholly within said upper zone of said deep pocket.

5. A semiconductor as claimed in claim 4 wherein said substrate is polycrystalline silicon, said pocket material is monocrystalline silicon, and said layer is a dielectric compound of silicon.

6. A semiconductor as claimed in claim 5 wherein said one conductivity is N-type, and said other conductivity is P-type.

7. A semiconductor as claimed in claim 4 including a third pocket of intermediate depth, said intermediate pocket having spaced apart source and drain regions of high conductivity and said one conductivity type and an interposed gate region of high conductivity and said other conductivity type and a channel area sandwiched between said gate regions and said dielectric layer, said gate and said base regions having substantially equal penetration within their respective pockets for providing a thinner channel in said shallow pocket than in said intermediate pocket and base region wholly within said upper zone of said deep pocket.

8. A semiconductor as claimed in claim 7 wherein said substrate is polycrystalline silicon, said pocket material is monocrystalline silicon, and said layer is a dielectric compound of silicon.

9. A semiconductor as claimed in claim 8 wherein said one conductivity type is N-type, and said other conductivity type is P-type.

References Cited

UNITED STATES PATENTS

| | | | |
|---|---|---|---|
| 3,293,087 | 12/1966 | Porter | 317—235 |
| 3,312,879 | 4/1967 | Godejahn | 317—235 |
| 3,332,137 | 7/1967 | Kenney | 317—235 |

OTHER REFERENCES

Electronics Review, vol. 37, No. 17, June 1, 1964, page 23.

Electronic Design, vol. 12, No. 8, Apr. 13, 1964, pages 12–14.

JAMES D. KALLAM, *Primary Examiner.*